(12) United States Patent
Thomasson

(10) Patent No.: US 6,255,877 B1
(45) Date of Patent: Jul. 3, 2001

(54) WIDE RANGE, VARIABLE PHASE SHIFT CIRCUIT

(75) Inventor: Samuel L. Thomasson, Gilbert, AZ (US)

(73) Assignee: Acoustic Technologies, Inc., Mesa, AZ (US)

(*) Notice: Subject to any disclaimer, the term of this patent is extended or adjusted under 35 U.S.C. 154(b) by 0 days.

(21) Appl. No.: 09/401,348

(22) Filed: Sep. 21, 1999

(51) Int. Cl.[7] .................................................. H03H 11/16
(52) U.S. Cl. ........................................... 327/237; 327/246
(58) Field of Search .................................... 327/237, 551, 327/553, 231, 308, 246

(56) References Cited

U.S. PATENT DOCUMENTS 5,983,082 * 11/1999 Hilbert ...................................... 455/76

* cited by examiner

Primary Examiner—Toan Tran
Assistant Examiner—Cassandra Cox
(74) Attorney, Agent, or Firm—Paul F. Wille

(57) ABSTRACT

A filter includes an FET and a capacitor in a phase shift network wherein the FET operates as a variable resistor. An impedance multiplier is coupled to the FET for increasing the range of resistance of the FET.

9 Claims, 2 Drawing Sheets

WIDE RANGE, VARIABLE PHASE SHIFT CIRCUIT

BACKGROUND OF THE INVENTION

This invention relates to a phase shift circuit and, in particular, to a phase shift circuit having an adjustable phase shift over a wide range of frequencies.

An all-pass filter is a filter that operates in the time domain rather than in the frequency domain. The filter passes all frequencies without affecting amplitude but shifts phase in proportion to frequency. Such filters are described in detail in chapter 7 of "Electronic Filter Design Handbook," A. B. Williams and F. J. Taylor, 3rd Ed., McGraw-Hill, Inc. 1995. The Williams et al. text is the only text known that describes all-pass filters in detail.

At high frequencies, e.g., radio frequencies, components exhibit a useful impedance or range of impedance without being physically large. At audio frequencies, particularly at low audio frequencies, passive impedances such as capacitors and inductors, become physically large.

Another problem with all-pass filter circuits is that the phase shift is not adjustable and, in particular, is not readily adjustable over a wide range. For many circuits, it is possible to calculate component values as though such components were commercially available or at least real. Thus, a phase shift circuit may define a range resistance, preferably a linear change, of two orders of magnitude. Alternatively, one may calculate a value of capacitance that is either unobtainable in any form or impossible to produce in an integrated circuit.

Varying the value of a resistor or a capacitor can be done mechanically but is preferably done electrically. Absent electronic control, a circuit cannot be put to practical use in any sort of control loop. Thus, what is desired is an impedance that can be varied over a wide range electronically.

Impedance multipliers are known in the art but these are typically too complicated and costly. A relatively simple circuit is disclosed in U.S. Pat. No. 5,652,537 (Fleeman) and in a book by the same author. One circuit from the patent is reproduced in FIG. 2 herein and described below. The circuits disclosed in these publications are curiously described as having "active negative feedback" even though the inverting input of an operational amplifier is not used.

As recognized in the Fleeman patent, an FET is highly non-linear, variable resistance because variations in $V_{ds}$ on the FET can create distortions in the response curves of the FET. The patent proposes improving linearity by reducing $V_{ds}$ to less than ±50 millivolts, which may make the circuit operative in a technical sense but of little practical interest. The Fleeman patent discloses an FET only in a voltage divider. By inference, using an FET as the multiplied impedance would multiply the non-linearity as well and should not be done.

In view of the foregoing, it is therefore an object of the invention to provide a phase shift circuit that can provide an adjustable phase shift over a wide range of frequencies.

A further object of the invention is to provide a phase shift circuit that can operate on input signals of five volts or more.

Another object of the invention is to provide a phase shift circuit that can substantially be implemented as an integrated circuit.

A further object of the invention is to provide a phase shift circuit that multiplies the resistance of an FET to obtain a frequency range of four orders of magnitude or more.

Another object of the invention is to provide a phase shift circuit that employs an RC phase shift circuit in which the resistor is a FET.

A further object of the invention is to provide a phase shift circuit that combines a filter with an impedance multiplier.

SUMMARY OF THE INVENTION

The foregoing objects are achieved in this invention wherein a phase shift network includes a FET as a variable resistor and includes an impedance multiplier coupled to the FET for increasing the range of resistance exhibited by the FET.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
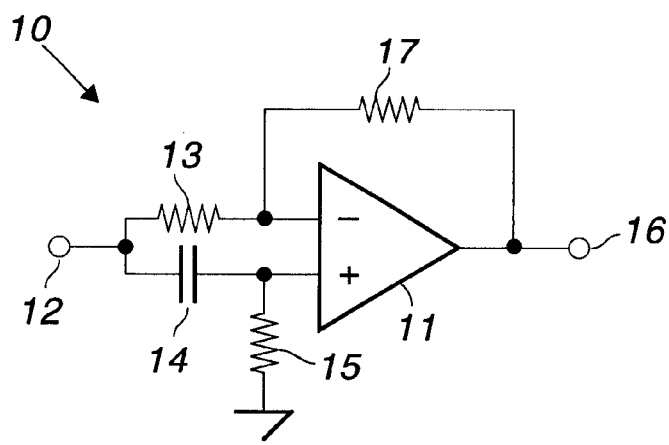
FIG. 1 is a schematic of an all-pass filter as described in the Williams et al. text.

In FIG. 1, all-pass filter 10 includes operational amplifier 11 having an inverting input coupled to input 12 by resistor 13 and having a non-inverting input coupled to input 12 by capacitor 14. The non-inverting input is also coupled to ground through resistor 15. Resistor 15 and capacitor 14 determine the phase shift or delay of the circuit. Filter output 16 is coupled to the inverting input of amplifier 11 by resistor 17. Resistors 13 and 17 have the same value, producing unity gain. If capacitor 14 is C and resistor 15 is R, the phase shift β is given by $$\beta(\omega) = -2\tan^{-1}\omega RC.$$

Figure 3:
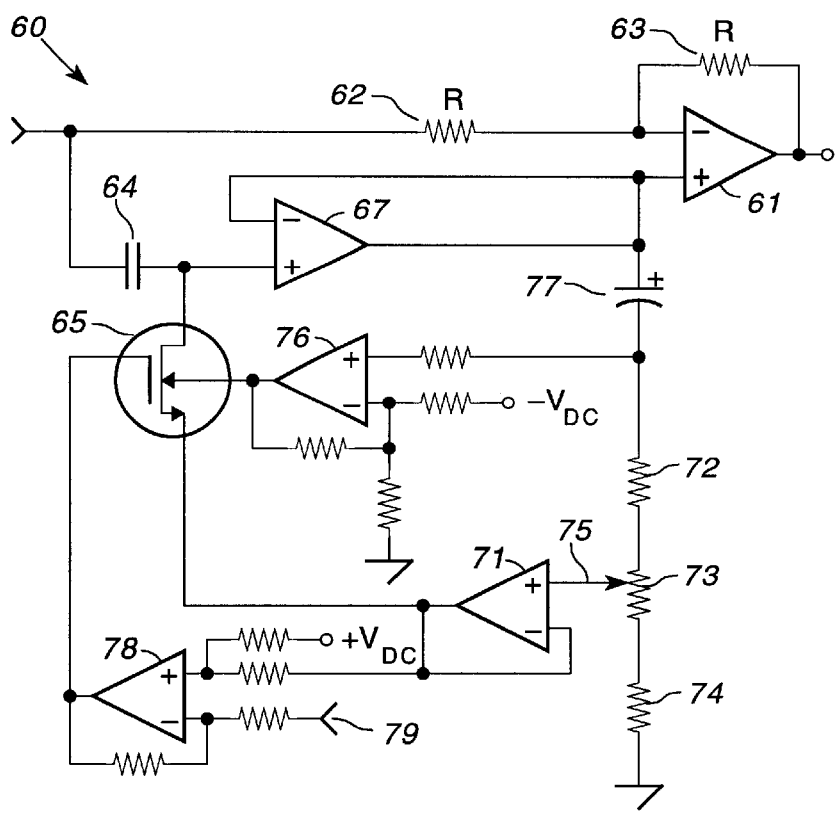
FIG. 3 is a schematic of an all-pass phase shift circuit constructed in accordance with a preferred embodiment of the invention.

The operation of the circuit is described in more detail in conjunction with FIG. 3.

Figure 2:
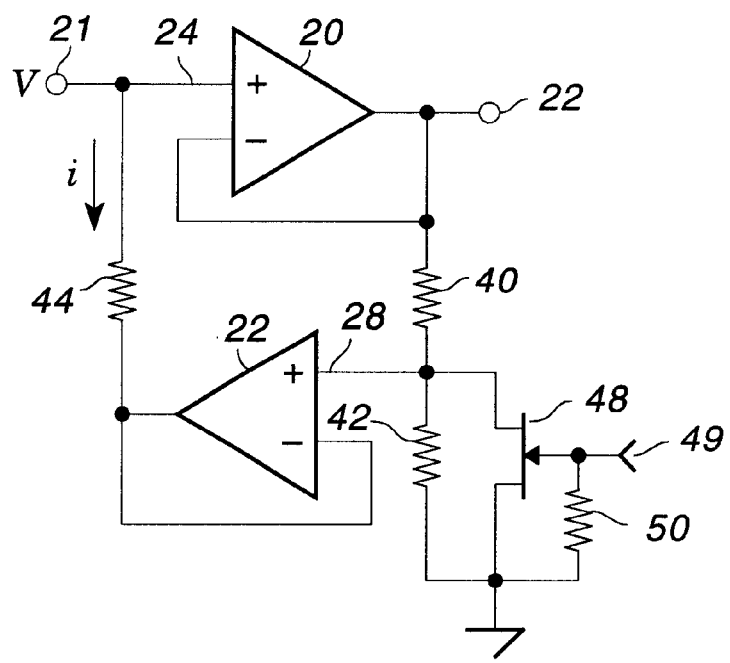
FIG. 2 is a schematic of an impedance multiplier as disclosed in FIG. 5 of the Fleeman patent.

FIG. 2 is a schematic of an impedance multiplier circuit from the Fleeman patent. The impedance multiplier includes two operational amplifiers 20 and 22, each configured as voltage follower amplifiers by virtue of the feedback to the inverting inputs thereof. Non-inverting input 24 of amplifier 20 is coupled to input 21. The output of amplifier 20 is coupled to a voltage divider including resistors 40 and 42 connected in series. The junction of resistors 40 and 42 is coupled to non-inverting input 28 of amplifier 22. The output of amplifier 22 is coupled through resistor 44 to non-inverting input 24 of amplifier 20.

Because amplifiers 20 and 22 are configured as voltage followers, a voltage on the non-inverting inputs is reproduced at their respective outputs. The current, i, flowing through resistor 44 is essentially the input current to the multiplier. Amplifier 20 has large input impedance and draws a current that is negligible in comparison.

The voltage at the output of amplifier 20 is substantially equal to the input voltage, V, and a fraction, f, of that voltage, determined by the voltage divider, is applied to amplifier 22. Thus, the voltage drop across resistor 44 is $(1-f) \times V$. Because the voltage drop across resistor 44 is reduced, the current through resistor 44 is reduced. If input impedance is defined as V/i, then the input impedance is increased by the voltage divider including resistors 40 and 42. The larger the fraction, the smaller the current, and the larger the impedance.

Junction field effect transistor (JFET) 48 provides a resistance path in parallel with resistor 42. The JFET is a voltage-variable resistance controlled by a negative gate-to-source dc bias voltage applied to control input 49. When JFET 48 is non-conducting, the largest fraction of input voltage is fed back to resistor 44. When JFET 48 is conducting, the fraction is reduced and the input impedance is reduced.

The circuit shown in FIG. 2 has several disadvantages. Reducing the source-to-drain voltage improves linearity at the expense of dynamic range. Restricting $V_{ds}$ to ±50 mV or less essentially restricts the input voltage to ±50 mV or less if resistor 40 has a resistance of 1 kΩ and resistor 42 has a resistance of 100 kΩ. Such a low signal level significantly reduces the signal to noise ratio in the circuit. An input voltage of at least several volts is desired.

If resistors 40 and 42 have the same resistance, e.g., 100 kΩ, the input impedance is doubled. This is not nearly enough to be useful in a phase shift circuit, wherein a resistance must be multiplied twenty-fold or more to reduce the size of the phase shift capacitor to values that can be accommodated in an integrated circuit.

FIG. 3 is a schematic of a phase shift circuit constructed in accordance with the invention. The portion of the circuit including amplifier 61, coupling resistor 62, feedback resistor 63, capacitor 64, and transistor 65 form an all-pass filter circuit with transistor 65 as the variable resistor. Transistor 65 is a programmable current source that enables one to adjust the phase shift, in conjunction with capacitor 64. The circuit illustrated in FIG. 1 has a limited range of phase shift and cannot be implemented as an integrated circuit (IC) because the component values are unattainable in IC form. Substantially the entire circuit shown in FIG. 3, except for the potentiometer and the coupling capacitor, can be implemented in IC form.

Amplifier 71 is a voltage follower coupling the voltage at tap 75 to the drain of transistor 65 and provides an impedance multiplication function, as described above, that depends upon the fraction of the voltage at the tap. Potentiometer 73 provides a trim function that provides a predetermined or default value for RC when there is no voltage at control input 79.

The impedance multiplier increases the dynamic range of transistor 65 and enables one to use relatively small valued capacitor for capacitor 64; e.g., 100 pf. Thus, capacitor 64 can be implemented in an integrated circuit. The circuit illustrated in FIG. 3 can sweep over four orders of magnitude in frequency, a feat unattainable with circuits of the prior art.

Capacitor 77 blocks direct current and couples the output from voltage follower 67 to the input of the voltage divider. Resistors 72 and 74 limit the range of multiplication and need not be equal. If the resistance above tap 75 is equal to the resistance below the tap, then the impedance multiplication is 2:1. If the resistance above tap 75 is R and the resistance below the tap is 99R, then the impedance multiplication is 100:1. In one embodiment of the invention resistor 72 had a resistance of 1.5 kΩ, resistor 73 had a resistance of 2.0 kΩ, and resistor 74 had a resistance of 100 kΩ.

The portion of the circuit including amplifier 67, the voltage divider, amplifier 71, and transistor 65 is reminiscent of, but quite different from, the circuit described in FIG. 2. In FIG. 3, amplifier 76 has a non-inverting input coupled to the input to the voltage divider. An inverting input of amplifier 76 coupled to a source of negative DC bias and to a feedback network for reducing the amplitude of the signal applied to the substrate of transistor 65.

Amplifier 78 has a non-inverting input coupled to tap 75 through voltage follower 71 and to a source of positive DC bias. An inverting input of amplifier 78 is coupled to input 79 for receiving a control voltage from an external source (not shown). Amplifier 76 biases the substrate of transistor 65 and amplifier 78 biases the gate of transistor 65. The resistances associated with these amplifiers are preferably equal valued, e.g., 100 kΩ. By thus biasing transistor 65, linearity and dynamic range are improved.

Figure 4:
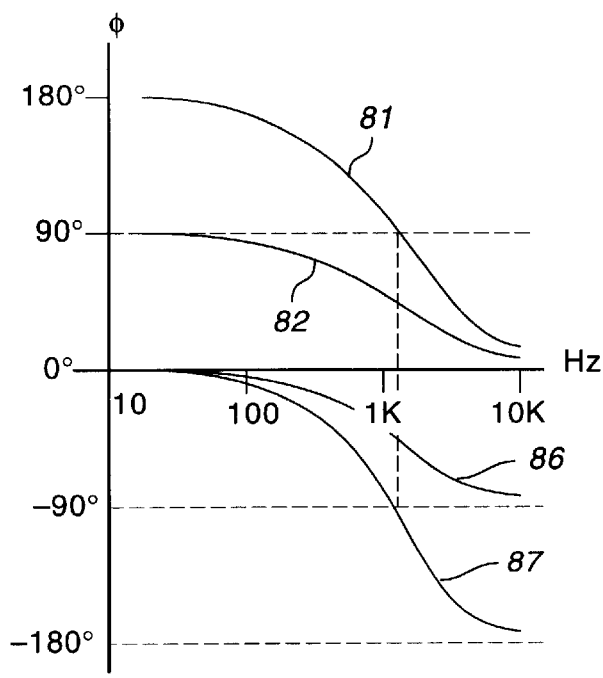
FIG. 4 is a chart of phase shift versus control voltage.

Curve 81 in FIG. 4 illustrates the phase shift characteristic of circuit 60, wherein φ (phi) is phase shift. A phase shift of 90° is obtained when $\omega = 1/RC$. Thus, changing the control voltage changes the frequency at which a 90° phase shift occurs. A phase shift of 180° occurs as one approaches DC (zero Hz.) and a phase shift of 0° occurs as one approaches very high (∞) frequency.

Figure 5:
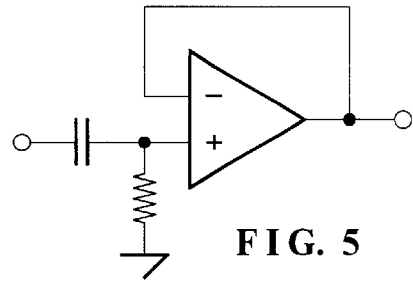
FIG. 5 is a schematic of a high pass filter.

The invention can be applied to a high pass filter, a low pass filter, or an all pass filter. Curve 82 in FIG. 4 is the characteristic curve for a circuit constructed in accordance with the invention but based upon a high pass filter (FIG. 5). Such a circuit is readily made by eliminating elements 61, 62, and 63 from the schematic of FIG. 3. The output of the circuit is taken from the output of amplifier 67.

Figure 6:
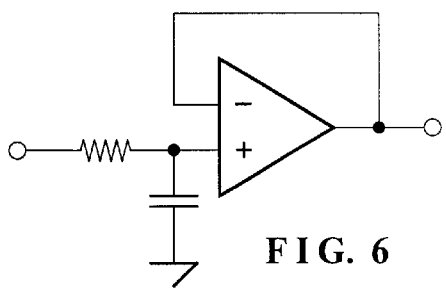
FIG. 6 is a schematic of a low pass filter.

Curve 86 is obtained from an all-pass filter circuit based upon a low pass filter (FIG. 6) modified in accordance with the invention. Curve 87 is obtained from a low pass filter modified in accordance with the invention. An advantage of using an all-pass filter, whether based upon a high pass filter or a low pass filter, is that the phase shift is over a range of 0°–180° rather than a range of 0°–90°.

The invention thus provides an adjustable phase shift over a wide range of frequencies. The circuit can operate on input signals of five volts or more. The circuit uses an RC phase shift circuit in which the resistor is a FET and the circuit multiplies the resistance of the FET to obtain a frequency range of over four orders of magnitude. The phase shift circuit combines an all-pass filter with an impedance multiplier and can substantially be implemented as an integrated circuit.

Having thus described the invention it will be apparent to those of skilled in the art that various modifications can be made within the scope of the invention. For example, the particular biases used depend upon the type of transistor, p-channel or n-channel, in the phase shift network.

What is claimed as the invention is:

1. Apparatus for adjusting the phase of an input signal, said apparatus comprising:
    a filter having a phase shift network including a capacitor and an FET operating as a variable resistor;
    an impedance multiplier coupled to said FET for increasing the range of resistance of said FET.

2. The apparatus as set forth in claim 1 wherein said filter is an all-pass filter.

3. The apparatus as set forth in claim 2 wherein said all-pass filter includes:
    a first amplifier having an inverting input coupled to said input signal and a non-inverting input, wherein said capacitor couples said input signal to said non-inverting input and to said FET.

4. The apparatus as set forth in claim 3 wherein said impedance multiplier includes:
    a second amplifier having a non-inverting input coupled to said capacitor and an output coupled to said non-inverting input of said first amplifier;

a voltage divider coupled between said output and common;

a third amplifier having a non-inverting input coupled to said voltage divider and an output, wherein said FET is coupled between the non-inverting input of said second amplifier and the output of said third amplifier.

5. The apparatus as set forth in claim 3 and further including:

a first bias source coupled to the substrate of said FET;

a second bias source coupled to the gate of said FET, wherein said second bias source includes a control input for receiving a control voltage for adjusting the phase of said input signal.

6. The apparatus as set forth in claim 1 wherein said filter is a high pass filter.

7. The apparatus as set forth in claim 6 wherein said high pass filter includes:

a first amplifier having an inverting input, a non-inverting input, and an output;

wherein said capacitor couples said input signal to said non-inverting input and to said FET and wherein said output is coupled to said input.

8. The apparatus as set forth in claim 7 wherein said impedance multiplier includes:

a voltage divider coupled between said output and common;

a second amplifier having a non-inverting input coupled to said voltage divider and an output, wherein said FET is coupled between the non-inverting input of said first amplifier and the output of said second amplifier.

9. The apparatus as set forth in claim 8 and further including:

a first bias source coupled to the substrate of said FET;

a second bias source coupled to the gate of said FET, wherein said second bias source includes a control input for receiving a control voltage for adjusting the phase of said input signal.

* * * * *